(12) United States Patent
Kim

(10) Patent No.: US 8,634,261 B2
(45) Date of Patent: Jan. 21, 2014

(54) SEMICONDUCTOR MEMORY DEVICE AND METHOD OF OPERATING THE SAME

(75) Inventor: Min Su Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 148 days.

(21) Appl. No.: 13/225,651

(22) Filed: Sep. 6, 2011

(65) Prior Publication Data

US 2012/0057419 A1    Mar. 8, 2012

(30) Foreign Application Priority Data

Sep. 6, 2010  (KR) .................. 10-2010-0087049
Jul. 28, 2011  (KR) .................. 10-2011-0075119

(51) Int. Cl.
 *G11C 29/00*    (2006.01)

(52) U.S. Cl.
 USPC ............. 365/200; 365/185.22; 365/230.06; 365/238.5

(58) Field of Classification Search
 USPC ............. 365/200, 230.06, 238.5, 185.22
 See application file for complete search history.

(56) References Cited

U.S. PATENT DOCUMENTS

| 7,352,630 | B2 * | 4/2008 | Lee et al. | 365/185.22 |
|---|---|---|---|---|
| 7,719,897 | B2 * | 5/2010 | Lee et al. | 365/185.22 |
| 7,830,720 | B2 * | 11/2010 | Lee et al. | 365/185.22 |
| 7,885,111 | B2 * | 2/2011 | Chae et al. | 365/185.09 |
| 8,085,592 | B2 * | 12/2011 | Yun et al. | 365/185.09 |
| 2010/0329021 | A1 * | 12/2010 | Lee | 365/185.19 |

FOREIGN PATENT DOCUMENTS

| KR | 1020030061877 A | 7/2003 |
|---|---|---|
| KR | 1020060078142 A | 7/2006 |
| KR | 1020100088921 A | 8/2010 |

* cited by examiner

*Primary Examiner* — Pho M Luu
(74) *Attorney, Agent, or Firm* — William Park & Associates Patent Ltd.

(57) ABSTRACT

A semiconductor memory device includes an address controller for storing fail column addresses and sequentially outputting the fail column addresses while a first control signal is activated and a control logic for performing control so that data indicating a program pass is inputted to each of main page buffers associated with the respective fail column addresses outputted from the address controller while the first control signal is activated.

15 Claims, 6 Drawing Sheets

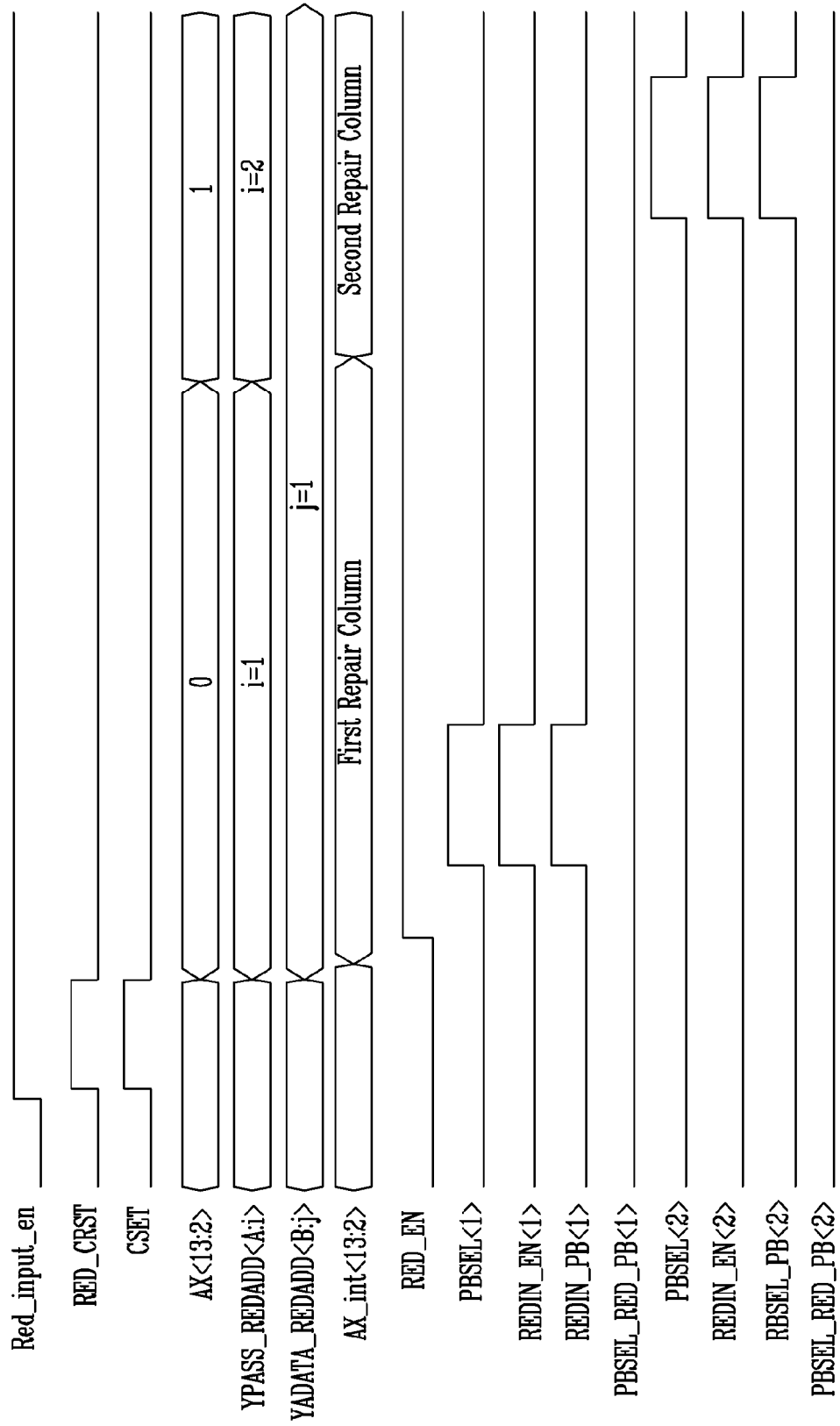

SEMICONDUCTOR MEMORY DEVICE AND METHOD OF OPERATING THE SAME

CROSS-REFERENCE TO RELATED APPLICATION

Priority is claimed to Korean patent application number 10-2010-0087049 filed on Sep. 6, 2010 and to Korean patent application number 10-2011-0075119 filed on Jul. 28, 2011, the entire disclosure of which is incorporated by reference herein.

BACKGROUND

Exemplary embodiments relate to semiconductor memory device and a method of operating the same.

A non-volatile semiconductor memory device may be electrically erased and programmed. Fowler-Nordheim (F-N) tunneling and hot electron injection methods are the principles utilized in a non-volatile memory device in an erase operation for erasing data stored in the memory cells and a program operation for storing data in the memory cells.

A memory cell coupled to a bit line in this semiconductor memory device may fail, and a failed cell may be repaired by replacing the fail memory cell with a redundancy cell. The repair operation is described below.

First, the address of a fail cell detected by the test operation of a semiconductor memory device is stored in a storage device, such as a CAM cell.

Next, as the power is provided to the semiconductor memory device, the fail cell address stored in the storage device is loaded onto a control unit.

The control unit determines whether an address received along with an operation command is the address of the fail cell. The control unit then performs control so that a redundancy cell is selected when the determined address is the fail cell address.

To perform a repair operation in a semiconductor memory device, a redundancy data input operation must be performed before program data is programmed. A redundancy data input operation is performed for inputting the redundancy data to a page buffer coupled to a bit line corresponding to each column address.

In performing a redundancy data input operation, the control unit may store data "1" in the page buffer coupled to the bit line corresponding to the fail cell address and store data "0" in the remaining page buffers.

By performing a redundancy data input operation, it would be unnecessary to perform a verification operation in a program verification.

In a redundancy data input operation, all column addresses are sequentially checked to determine whether each of the column addresses correspond to the fail cell address. However, checking all column addresses and inputting data to the page buffers in performing a redundancy data input operation are undesirably lengthy.

BRIEF SUMMARY

Exemplary embodiments relate to a semiconductor memory device and a method of operating the same, in which redundancy data is selectively inputted to only a main page buffer coupled to a bit line corresponding to a failed column address, and only a redundancy page buffer coupled to a redundancy bit line corresponding to a redundancy column address corresponding to the failed column address.

A semiconductor memory device according to an aspect of the present disclosure includes an address controller for storing fail column addresses and sequentially outputting the fail column addresses while a first control signal is activated and a control logic for performing control so that data indicating a program pass is inputted to each of main page buffers associated with the respective fail column addresses outputted from the address controller while the first control signal is activated.

A semiconductor memory device according to another aspect of the present disclosure includes main page buffers coupled to respective main columns and coupled to a data line in response to a plurality of first select signals, respectively; redundancy page buffers coupled to respective redundancy columns and to the data line in response to a plurality of second select signals, respectively, and configured to store data, indicating the execution of a program, in response to a plurality of second control signals, respectively; an address controller configured to store fail column addresses and to sequentially output the fail column addresses while a first control signal is activated; a control logic configured to input data, indicating a program pass, through the data line while the first control signal is activated and to output a page buffer select signal for selecting the main page buffer associated with the fail column address outputted from the address controller and the redundancy page buffer associated with a redundancy column address to replace the fail column address; and a page buffer control circuit configured to enable one of the plurality of first select signals in order to select the main page buffer, corresponding to the page buffer select signal of the control logic, and enable one of the plurality of second control signals in order to select the redundancy page buffer, while the first control signal is activated.

The address controller includes an address decoding unit configured to generate a decoding signal whenever an external address is received while the first control signal is activated and an address storage unit configured to include a plurality of registers for storing the respective fail column addresses and to output the fail column address stored in the register selected in response to the decoding signal.

The page buffer control circuit includes a main page buffer select circuit for outputting the first select signal corresponding to the page buffer select signal, in response to a redundancy enable signal, the first control signal, and the page buffer select signal and a redundancy page buffer control circuit for outputting the second select signal or the second control signal corresponding to the page buffer select signal, in response to the page buffer select signal, the redundancy enable signal, and the first control signal.

The main page buffer control circuit includes a NAND gate for performing a NAND operation for the redundancy enable signal and an inverted signal of the second control signal and a first AND gate for outputting the first select signal corresponding to the page buffer select signal by performing a NAND operation for the page buffer select signal and an output signal of the NAND gate.

The redundancy page buffer control circuit includes a second AND gate for performing an AND operation for the page buffer select signal and the redundancy enable signal; a third AND gate for outputting the second control signal corresponding to the page buffer select signal by performing an AND operation for the first control signal and the output signal of the second AND gate; and a fourth AND gate for outputting the second select signal corresponding to the page buffer select signal by performing an AND operation for the first control signal and an output signal of the second AND gate.

The control logic stores data '0' in all the latches of the main page buffers and data '1' in all the latches of the redundancy page buffers, before activating the first control signal.

The address controller further includes an address latch circuit unit for temporarily storing the fail column address outputted from the address storage unit and providing the stored fail column address to a multiplexer.

A method of operating a semiconductor memory device according to yet another aspect of the present disclosure includes inputting data '0' to the latches of main page buffers coupled to a main column and data '1' to the latches of redundancy page buffers coupled to a redundancy column, before starting inputting redundancy data; sequentially selecting the main page buffers associated with fail column addresses in order to input the redundancy data; and changing data of the selected main page buffer into '1' and data of the redundancy page buffer coupled to a redundancy column line, corresponding to the fail column address, into '0'.

Sequentially selecting the main page buffers associated with fail column addresses includes sequentially selecting storage units in which the respective fail column addresses are stored whenever external addresses are received; outputting the fail column address stored in the selected storage unit; and selecting the main page buffer associated with the outputted fail column address.

BRIEF DESCRIPTION OF THE DRAWINGS

FIG. 7 is a timing diagram of control signals for illustrating the redundancy data input operation of FIG. 6.

DESCRIPTION OF EMBODIMENTS

Hereinafter, various embodiments of the present invention will be described in detail with reference to the accompanying drawings.

Figure 1:
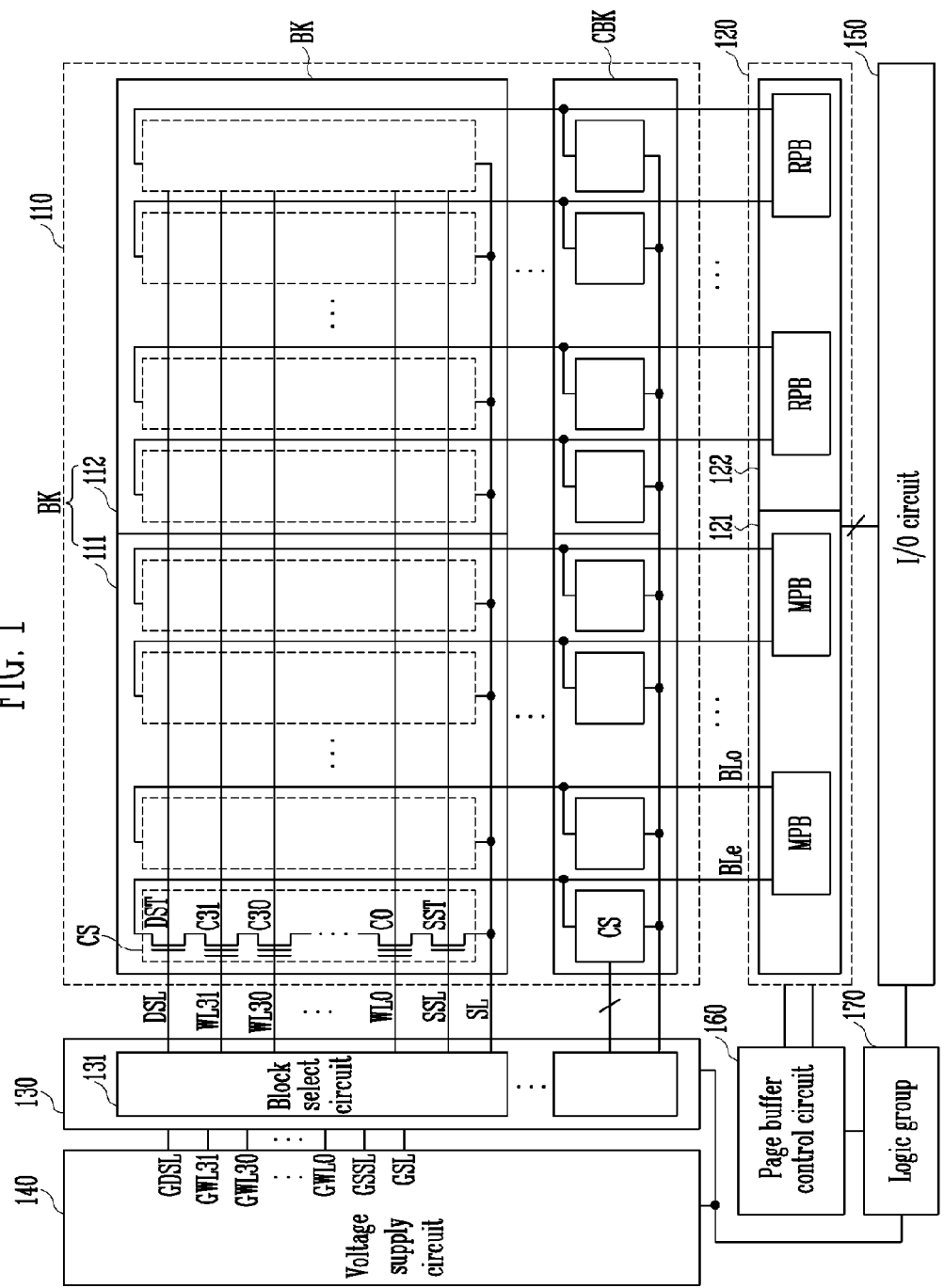
FIG. 1 shows a semiconductor memory device illustrating this disclosure.

FIG. 1 shows a semiconductor memory device according to an embodiment of this disclosure.

Referring to FIG. 1, the semiconductor memory device 100 includes a memory cell array 110, a page buffer group 120, an X decoder 130, a voltage supply circuit 140, an I/O circuit 150, a page buffer control circuit 160, and a logic group 170.

The memory cell array 110 includes a plurality of memory blocks BK. Some of the memory blocks are used as content addressable memory (CAM) blocks CBK for storing option information and repair column address information. The CAM block CBK ha the same configuration as the memory block BK.

Each of the memory blocks BK includes a main cell unit 111 and a redundancy cell unit 112. Furthermore, each of the main cell unit 111 and the redundancy cell unit 112 includes a plurality of cell strings CS. The cell strings CS of the main cell unit 111 and the redundancy cell unit 112 may have the same configuration.

FIG. 1 shows only one among many cell strings CS of the main cell unit 111.

The cell string CS includes a plurality of memory cells such as, for example, $0^{th}$ to $31^{st}$ memory cells C0 to C31 as shown in FIG. 1 that are coupled in series between a drain select transistor DST and a source select transistor SST.

A drain select line DSL is coupled to the gate of the drain select transistor DST, and a bit line is coupled to the drain of the drain select transistor DST. The bit line is divided into an even bit line BLe and an odd bit line BLo.

A source select line SSL is coupled to the gate of the source select transistor SST, and the source of the source select transistor SST is coupled to a common source line SL.

Furthermore, a plurality of word lines such as, for example, $0^{th}$ to $31^{st}$ word lines WL0 to WL31 as shown in FIG. 1 are coupled to the respective gates of, for example, the $0^{th}$ to $31^{st}$ memory cells C0 to C31.

When a cell string CS in the main cell unit 111 is determined to have failed, the fail cell string CS in the main cell unit 111 is to be replaced with a cell string CS in the redundancy cell unit 112. To accomplish this, a repair column address relating to a fail cell string such as the column address of the bit line coupled to the fail cell string CS in the main cell unit 111 needs to be stored.

The repair column address may be stored in a memory unit such as CAM block CBK of the memory cell array 110 or in an additional circuit (not shown) such as a fuse.

When operating a semiconductor memory device 100 according to an embodiment of the present invention, the repair column address stored in the CAM block CBK is loaded and stored in a storage unit in the logic group 170. The repair column address stored in the logic group 170 is then available for program and read operations.

The page buffer group 120 includes a main page buffer group 121 and a redundancy page buffer group 122. The main page buffer group 121 includes a plurality of main page buffers MPB. The redundancy page buffer group 122 includes a plurality of redundancy page buffers RPB.

Each of the main page buffers MPB is coupled to a pair of even and odd bit lines BLe, BLo of the main cell unit 111. Each of the redundancy page buffers RPB is coupled to a pair of even and odd bit line BLe, BLo of the redundancy cell unit 112.

Each of the main page buffer MPB and the redundancy page buffer RPB stores data to be programmed into a selected memory cell or the data read from a selected memory cell.

The X decoder 130 includes a plurality of block select circuits 131 that are coupled to the memory blocks BK. For example, FIG. 1 shows the X decoder 130 coupled to the memory cell array 110.

Referring to FIG. 1, the block select circuit 131 receives a control signal from the logic group 170 and is capable of coupling the drain select line DSL, the source select line SSL, and the $0^{th}$ to $31^{st}$ word lines WL0 to WL31 of the memory block BK to the global drain select line GDSL, the global source select line GSSL, and the global word lines GWL0 to GWL31 of the voltage supply circuit 140, in response to the control signal.

The voltage supply circuit 140 generates the operating voltages (e.g., a program voltage Vpgm, a read voltage Vread, a pass voltage Vpass, an erase voltage Verase, etc.) in response to the one or more control signals generated by the logic group 170.

The operating voltages generated by the voltage supply circuit 140 are provided to the global drain select line GDSL, the global source select line GSSL, and the global word lines GWL0 to GWL31 or the well of the memory block.

The I/O circuit 150 provides a data transfer path between the page buffer group 120 and a data input pad (not shown) in response to a control signal from the logic group 170. Furthermore, when a redundancy data input operation is performed, the page buffer control circuit 160 generates the control signals for the main page buffer group 121 and the redundancy page buffer group 122.

Furthermore, the logic group 170 generates the control signals for controlling the page buffer group 120, the X decoder 130, the voltage supply circuit 140, the I/O circuit 150, and the page buffer control circuit 160.

The logic group 170 includes an address controller (not shown) for address control and a storage unit (not shown) for temporarily storing repaired column addresses. The logic group 170 controls the page buffer group 120 and the page buffer control circuit 160, so that the redundancy data is inputted to (1) only the main page buffer MPB coupled to a bit line corresponding to a failed column address and (2) only the redundancy page buffer RPB coupled to a bit line corresponding to a redundancy column address instead of the failed column address, using a repair column address.

That is, the semiconductor memory device according to an embodiment of the present invention performs a repair operation by (1) replacing a bit line coupled to a fail cell string with a redundancy bit line and (2) replacing a column address corresponding to the bit line coupled to the fail cell string with a redundancy column address.

Furthermore, the semiconductor memory device performs program and program verification operations per page. The result of a program verification operation is stored in a page buffer, and whether a program operation is a pass can be determined based on the data state of the page buffer.

The program verification data is not typically stored in the main page buffer MPB coupled to a fail column, and it would thus not be possible to complete the program operation. Then, the data corresponding to a program pass is inputted to the main page buffer MPB coupled to the fail column before performing a program operation, so that the relevant main page buffer MPB is excluded in the program verification operation. The operation of inputting a program pass data to the main page buffer MPB coupled to the fail column is referred to as the redundancy data input operation.

In general, in order to input redundancy data, a process of determining whether the first to last columns of the main cell unit 111 have been sequentially repaired is performed, and the data indicative of a program pass are stored in the main page buffer MPB coupled to a repaired column. Accordingly, the time it would take to check whether all the columns have been repaired should not be very long.

According to an embodiment of the present invention, only the main page buffer MPB coupled to a fail column is selected and the data indicating a program pass is inputted.

Figure 2:
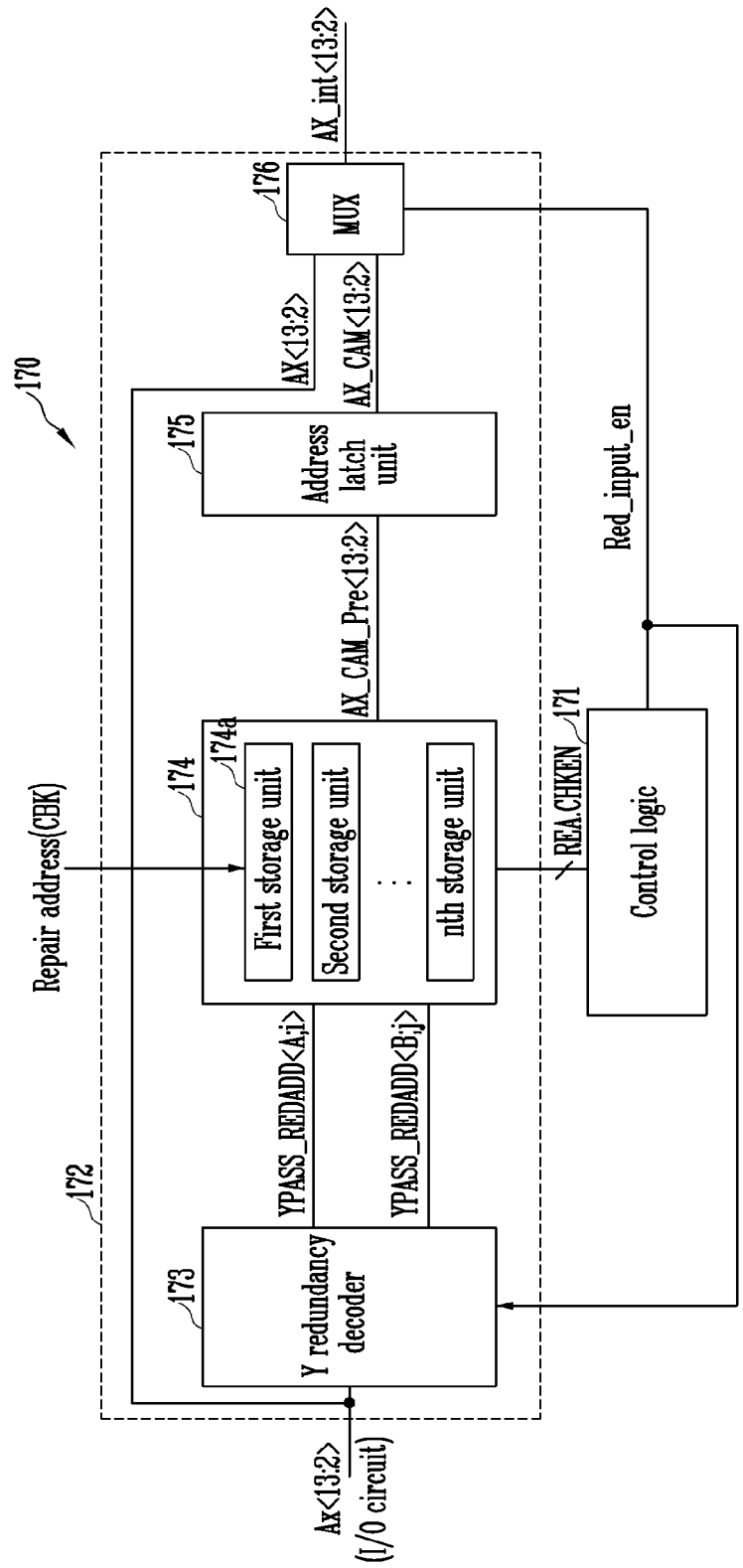
FIG. 2 shows a logic group of FIG. 1.

Referring to FIG. 2, the logic group 170 includes a control logic 171 and an address controller 172. Among many logics in the logic group 170 for performing the program and read operations, the logics related to describing an embodiment of the present invention are shown in FIG. 2.

The control logic 171 generates the control signals to perform a program operation, a read operation, and other operations of the semiconductor memory device 100 including the redundancy data input.

Furthermore, in response to a redundancy data input enable signal Red_input_en, the address controller 172 sequentially outputs external addresses AX<13:2> without change in a normal operation mode and sequentially outputs previously stored repair addresses in a redundancy data input operation mode. The external addresses AX<13:2> is outputted from an additional logic (not shown) for the address control of the logic group 170 and inputted to the address controller 172.

Furthermore, the repair addresses are stored in the CAM block CBK. The repair addresses are read from the CAM block CBK when the semiconductor memory device 100 is initially operated and then stored.

The address controller 172 includes a Y redundancy decoder 173, a storage unit 174, an address latch unit 175, and a multiplexer (MUX) 176. The storage unit 174 includes first to $n^{th}$ (n is a natural number greater than 1) storage units 174a. An n number of the repair addresses are stored in the first to $n^{th}$ storage units 174a, respectively.

The first to $n^{th}$ storage units 174a may have the same configuration, and only one of them is labeled with 174a in FIG. 2.

Furthermore, the Y redundancy decoder 173 is operated in response to the redundancy data input enable signal Red_input_en. When the external addresses AX<13:2> are received, the Y redundancy decoder 173 outputs first Y pass signals YPASS_REDADD<A:i> and second Y pass signals YPASS_REDADD<B:j> (1≤i≤n, 1≤j≤n; i and j are natural numbers) for sequentially enabling the first to $n^{th}$ storage units 174a of the storage unit 174. The Y redundancy decoder 173 counts 1 to n and sequentially outputs the first pass signals YPASS_REDADD<A:1> to YPASS_REDADD<A:n> and the second pass signals YPASS_REDADD<B:1> to YPASS_REDADD<B:n> in order of the counting.

Repair addresses stored in a $k^{th}$ storage unit 174a selected by the Y redundancy decoder 173, from among the repair addresses stored in the storage unit 174, are stored as CAM latch addresses AX_CAM_Pre<13:2>.

The address latch unit 175 stores the CAM latch addresses AX_CAM_Pre<13:2> and outputs the CAM latch addresses as CAM addresses AX_CAM<13:2> in response to the control signal of the control logic 171. The CAM address is one of the repair addresses stored in the CAM block.

The external addresses AX<13:2> inputted to the Y redundancy decoder 173 are also inputted to the MUX 176.

The MUX 176 selects one of the external addresses AX<13:2> and the CAM addresses AX_CAM<13:2> in response to the redundancy data input enable signal Red_input_en of the control logic 171 and outputs the selected addresses as internal addresses AX_int<13:2>.

The control logic 171 controls the redundancy data input operation for inputting the data indicating the result of a pass to the main page buffer MPB coupled to a column selected by the internal addresses AX_int<13:2>.

The control logic 171 inputs the data indicating the result of a program pass to the main page buffer MPB coupled to a column selected by the internal addresses AX_int<13:2> outputted from the MUX 176.

Meanwhile, the first to $n^{th}$ storage units 174a according to an embodiment of the present invention are described below.

Figure 3:
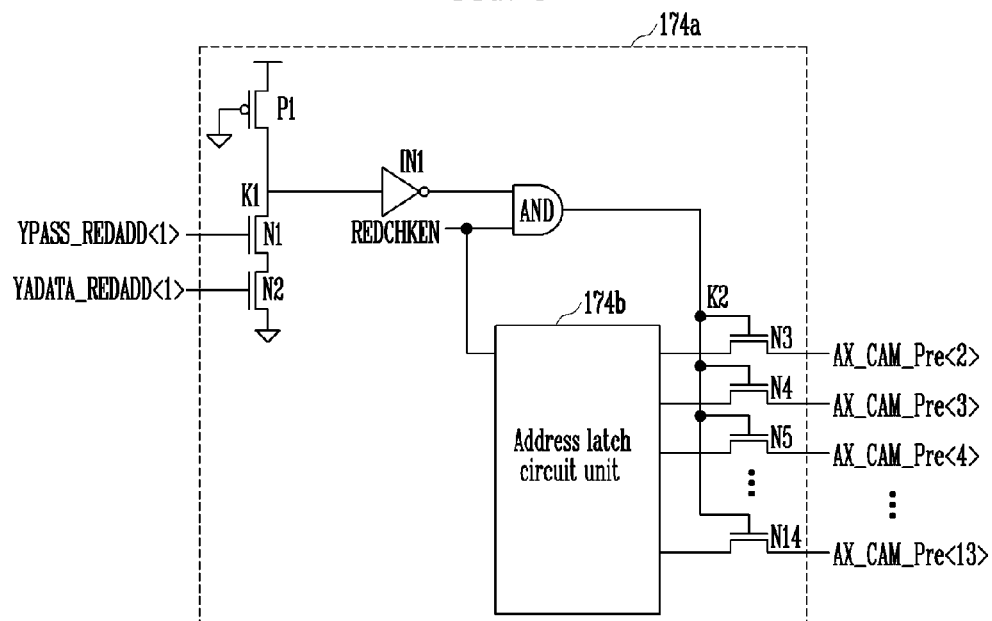
FIG. 3 shows a first storage unit of FIG. 2.

FIG. 3 shows the first storage unit 174a of FIG. 2.

The first to $n^{th}$ storage units 174a of FIG. 2 may have the same configuration although only the first storage unit 174a is shown in FIG. 3.

Referring to FIG. 3, the first storage unit 174a includes a first PMOS transistor P1, $1^{st}$ to $14^{th}$ NMOS transistors N1 to N14, a first inverter IN1, an AND gate AND, and an address latch circuit unit 174b.

The first PMOS transistor P1 and the first and the second NMOS transistors N1 and N2 are coupled in series between a power supply voltage terminal and a ground node. The gate of the first PMOS transistor P1 is coupled to the ground node so as to turn on the first PMOS transistor P1.

Furthermore, the first pass signal YPASS_REDADD<1> is inputted to the gate of the first NMOS transistor N1, and the second pass signal YPASS_REDADD<1> is inputted to the gate of the second NMOS transistor N2.

A node K1 between the first PMOS transistor P1 and the first NMOS transistor N1 is coupled to the input terminal of the first inverter IN1. The first inverter IN1 is coupled between the node K1 and the input terminal of the AND gate AND.

The two signals inputted to the AND gate AND are the output signal of the first inverter IN1 and a redundancy check signal REDCHKEN.

The output of the AND gate AND, which is a node K2, are inputted to the gates of the NMOS transistors N3 to N14.

The address latch circuit unit 174b stores the repair addresses in response to the control signal of the control logic 171. According to an embodiment of the present invention, the repair address is the address of a fail column, and a column address could be 12 bits long. Then, a repair address would be of 12 address bits, and the address latch circuit unit 174b would include the 12 latch circuits (not shown) for storing the 12 address bits.

The 12 address bits respectively stored in the 12 latch circuits (not shown) are outputted as the CAM latch addresses AX_CAM_Pre<13:2> through the third to fourteenth NMOS transistors N3 to N14.

The third to fourteenth NMOS transistors N3 to N14 are coupled to the respective latch circuits (not shown) in the address latch circuit unit 174b for storing the respective address bits and are turned on in response to the output of the AND gate AND.

The CAM latch addresses AX_CAM_Pre<13:2> are stored in the address latch unit 175 for the respective address bits. Accordingly, the address latch unit 175 (referring back to FIG. 2) may include 12 latch circuits (not shown) for storing 12 CAM latch address bits.

The address latch unit 175 outputs the stored CAM latch addresses AX_CAM_Pre<13:2> as the CAM addresses AX_CAM<13:2>. Furthermore, the MUX 176 selects one of the CAM addresses AX_CAM<13:2> and the external addresses AX<13:2> in response to the redundancy data input enable signal Red_input_en and outputs the selected addresses as the internal address AX_int<13:2>.

The control logic 171 inputs data indicating a program pass to the selected main page buffer MPB in response to the internal addresses AX_int<13:2>.

When the redundancy data input operation is performed, the operation of the main page buffer group 121 and the operation of the redundancy page buffer group 122 are controlled separately. That is, the page buffer control circuit 160 inputs separate control signals to the main page buffer group 121 and the redundancy page buffer group 122.

The main page buffer MPB and the redundancy page buffer RPB of the semiconductor memory device according to an embodiment of the present invention are described below.

Figure 4A:
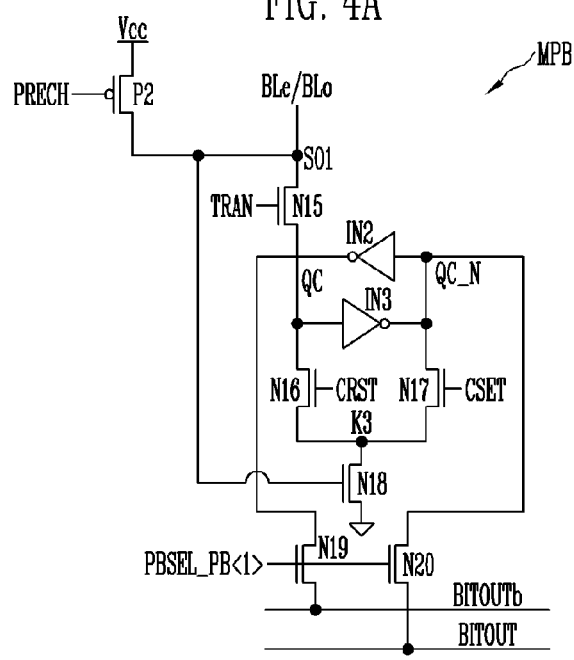
FIG. 4A shows a main page buffer of FIG. 1.
Figure 4B:
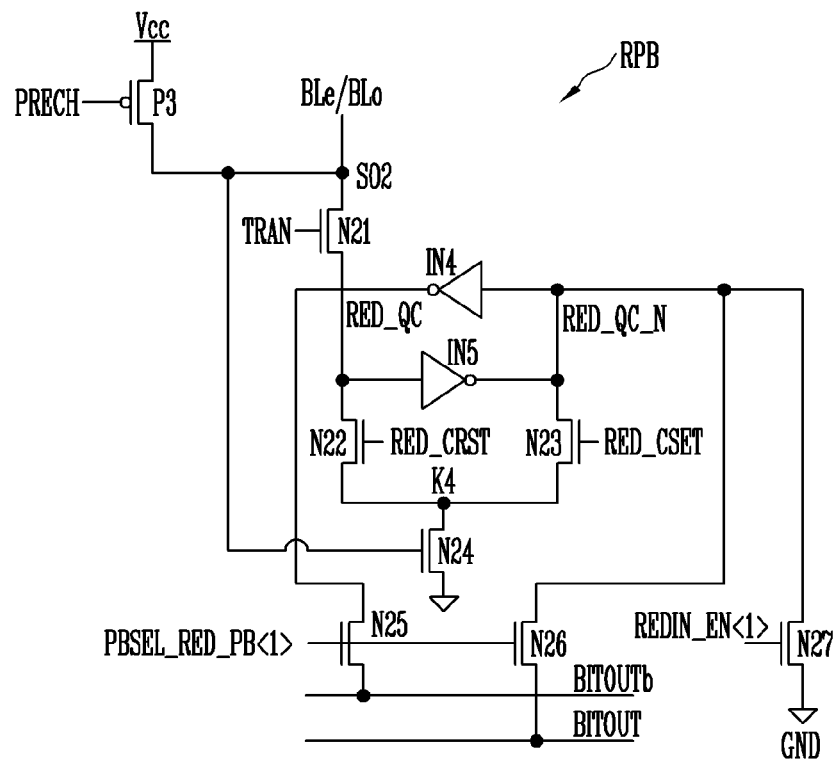
FIG. 4B shows a redundancy page buffer of FIG. 1.

FIG. 4A shows the main page buffer MPB of FIG. 1, and FIG. 4B shows the redundancy page buffer RPB of FIG. 1.

The main page buffer MPB and the redundancy page buffer RPB of FIGS. 4A and 4B respectively show the first main page buffer MPB of the main page buffer group 121 and the first redundancy page buffer RPB of the redundancy page buffer group 122 shown in FIG. 1.

Referring to FIG. 4A, the main page buffer MPB includes a second PMOS transistor P2, $15^{th}$ to $20^{th}$ NMOS transistors N15 to N20, and second and third inverters IN2 and IN3. The second PMOS transistor P2 is coupled between the power supply voltage terminal and a first sense node SO1. The second PMOS transistor P2 precharges the first sense node SO1 in response to a precharge signal PRECH.

The first sense node SO1 is coupled to the bit line BLe or BLo. The $15^{th}$ NMOS transistor N15 is coupled between the first sense node SO1 and a node QC. A transfer signal TRAN is inputted to the gate of the $15^{th}$ NMOS transistor N15.

The second and the third inverters IN2 and IN3 are coupled between the node QC and a node QC_N in the form of a latch circuit.

The $16^{th}$ NMOS transistor N16 is coupled between the node QC and a node K3. The $17^{th}$ NMOS transistor N17 is coupled between the node QC_N and the node K3.

A main reset control signal CRST is inputted to the gate of the $16^{th}$ NMOS transistor N16. A main set control signal CSET is inputted to the gate of the $17^{th}$ NMOS transistor N17.

The $18^{th}$ NMOS transistor N18 is coupled between the node K3 and the ground node. The first sense node SO1 is coupled to the gate of the $18^{th}$ NMOS transistor N18.

The $19^{th}$ NMOS transistor N19 is coupled between the node QC and a first data line BITOUTb. The $20^{th}$ NMOS transistor N20 is coupled between the node QC_N and a second data line BITOUT.

A first main page buffer select signal PBSEL_PB<1> is coupled to the gates of the $19^{th}$ NMOS transistor N19 and the $20^{th}$ NMOS transistor N20. The main page buffer MPB of FIG. 4A is the first main page buffer MPB of the main page buffer group 121, and thus the first main page buffer select signal PBSEL_PB<1> is inputted to the main page buffer MPB of FIG. 4A. The remaining page buffer select signals are inputted to the remaining main page buffers MPB, respectively. For example, a $k^{th}$ page buffer select signal PBSEL_PB<k> is inputted to a $k^{th}$ main page buffer MPB.

The redundancy page buffer RPB is described below with reference to FIG. 4B. The redundancy page buffer RPB includes a third PMOS transistor P3, $21^{st}$ to $27^{th}$ NMOS transistors N21 to N27, and fourth and fifth inverters IN4 and IN5.

The third PMOS transistor P3 is coupled between the power supply voltage terminal and a second sense node SO2. The third PMOS transistor P3 precharges the second sense node SO2 in response to the precharge signal PRECH.

The second sense node SO2 is coupled to the bit line BLe or BLo selected by the redundancy cell unit 112.

The $21^{st}$ NMOS transistor N21 is coupled between the second sense node SO2 and a node RED_QC. The transfer signal TRAN is inputted to the gate of the $21^{st}$ NMOS transistor N21.

The fourth and the fifth inverters IN4 and IN5 are coupled between the node RED_QC and a node RED_QC_N in the form of a latch circuit.

The $22^{nd}$ NMOS transistor N22 is coupled between the node RED_QC and a node K4. The $23^{rd}$ NMOS transistor N23 is coupled between the node RED_QC_N and the node K4.

A redundancy reset signal RED_CRST is inputted to the gate of the $22^{nd}$ NMOS transistor N22. A redundancy set signal RED_CSET is inputted to the gate of the $23^{rd}$ NMOS transistor N23.

The $24^{th}$ NMOS transistor N24 is coupled between the node K4 and the ground node. The gate of the $24^{th}$ NMOS transistor N24 is coupled to the second sense node SO2.

The $25^{th}$ NMOS transistor N25 is coupled between the node RED_QC and the first data line BITOUTb. The $26^{th}$ NMOS transistor N26 is coupled between the node REC_QC_N and the second data line BITOUT.

A first redundancy page buffer select signal PBSEL_RED_PB<1> is inputted to the gate of the $25^{th}$ and the $26^{th}$ NMOS transistors N25 and N26.

The 27th NMOS transistor N27 is coupled between the node RED_QC_N and the ground node. A first redundancy input enable signal REDIN_EN<1> is inputted to the gate of the 27th NMOS transistor N27.

The redundancy page buffer RPB of FIG. 4B is the first redundancy page buffer RPB of the redundancy page buffer group 122 of FIG. 1. Accordingly, the first redundancy page buffer select signal PBSEL_RED_PB<1> and the first redundancy input enable signal REDIN_EN<1> are inputted to the redundancy page buffer RPB of FIG. 4B.

The remaining redundancy page buffer select signals and the remaining redundancy input enable signals are inputted to the remaining redundancy page buffers RPB, respectively.

In the main page buffer MPB and the redundancy page buffer RPB shown in FIGS. 4A and 4B, the precharge signal PRECH and the transfer signal TRAN may be common signals inputted to the main page buffer MPB and the redundancy page buffer RPB at the same time.

Furthermore, the main reset signal CRST and the main set signal CSET may be inputted to only the main page buffer MPB, and the redundancy reset signal RED_CRST and the redundancy set signal RED_CSET may be inputted to only the redundancy page buffer RPB.

When the redundancy data input operation is started, the control logic 171 makes the node QC_N of the main page buffer MPB '0' and the node RED_QC_N of the redundancy page buffer RPB '1'.

The main reset signal CRST and the main set signal CSET, and the redundancy reset signal RED_CRST and the redundancy set signal RED_CSET are outputted as described above.

Furthermore, the page buffer control circuit 160 is configured to control the operations of the main page buffer MPB and the redundancy page buffer RPB.

Figure 5:
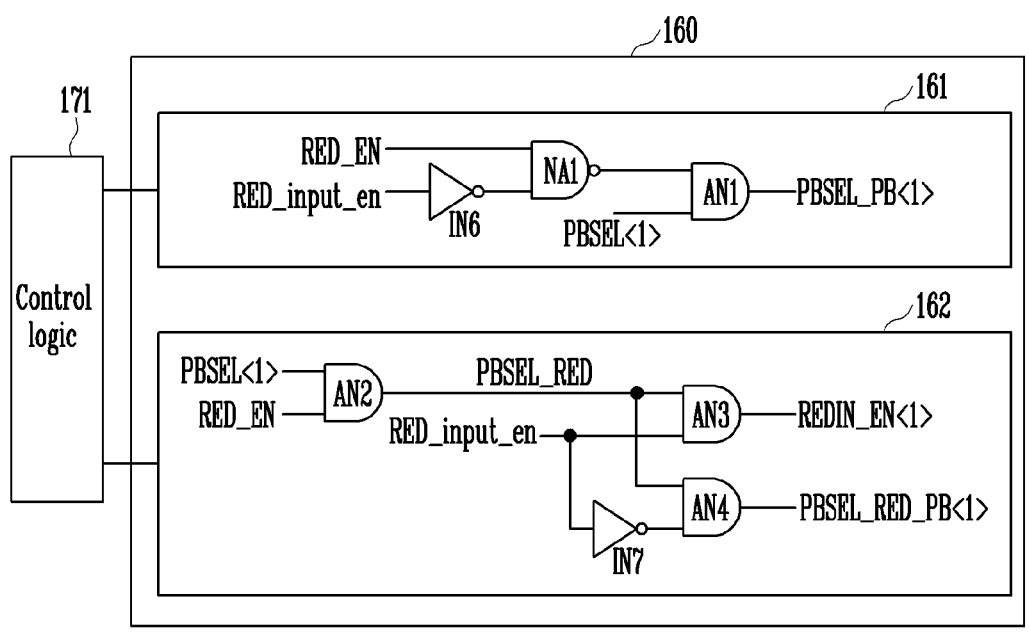
FIG. 5 shows a page buffer control circuit of FIG. 1.

FIG. 5 shows the page buffer control circuit 160 of FIG. 1.

In FIG. 5, the page buffer control circuit 160 outputs the control signals for controlling the main page buffer MPB of FIG. 4A and the redundancy page buffer RPB of FIG. 4B.

Referring to FIG. 5, the page buffer control circuit 160 includes a main page buffer control unit 161 and a redundancy page buffer control unit 162.

The main page buffer control unit 161 includes a first NAND gate NA1, a first AND gate AN1, and a sixth inverter IN6.

The redundancy page buffer control unit 162 includes second to fourth AND gates AN2 to AN4 and a seventh inverter IN7.

The sixth inverter IN6 inverts the redundancy data input enable signal Red_input_en received from the control logic 171 and outputs the inverted signal.

The output of the sixth inverter IN6 is inputted to one input terminal of the first NAND gate NA1. A redundancy enable signal RED_EN is inputted to the other input terminal of the first NAND gate NA1.

The output of the first NAND gate NA1 is inputted to one input terminal of the first AND gate AN1. A first page buffer select signal PBSEL<1> is inputted to the other input terminal of the first AND gate AN1.

Furthermore, the output of the first AND gate AN1 becomes the first main page buffer select signal PBSEL_PB<1>.

Furthermore, the first page buffer select signal PBSEL<1> and the redundancy enable signal RED_EN are inputted to the second AND gate AN2 of the redundancy page buffer control circuit 162.

The output of the second AND gate AN2 becomes a redundancy select signal PBSEL_RED.

The redundancy select signal PBSEL_RED is inputted to one input terminal of each of the third and the fourth AND gates AN3 and AN4.

The redundancy data input enable signal Red_input_en is inputted to the other input terminal of the third AND gate AN3.

The seventh inverter IN7 inverts the redundancy data input enable signal Red_input_en and outputs the inverted signal. The output of the seventh inverter IN7 is inputted to the other input terminal of the fourth AND gate AN4.

The output of the third AND gate AN3 becomes the first redundancy input enable signal REDIN_EN<1>. Furthermore, the output of the fourth AND gate AN4 becomes the first redundancy page buffer select signal PBSEL_RED_PB<1>.

The page buffer control circuit 160 selects one of the main page buffer MPB and the redundancy page buffer RPB. Furthermore, the redundancy data input operation is performed in response to the control signal of the control logic 171.

Figure 6:
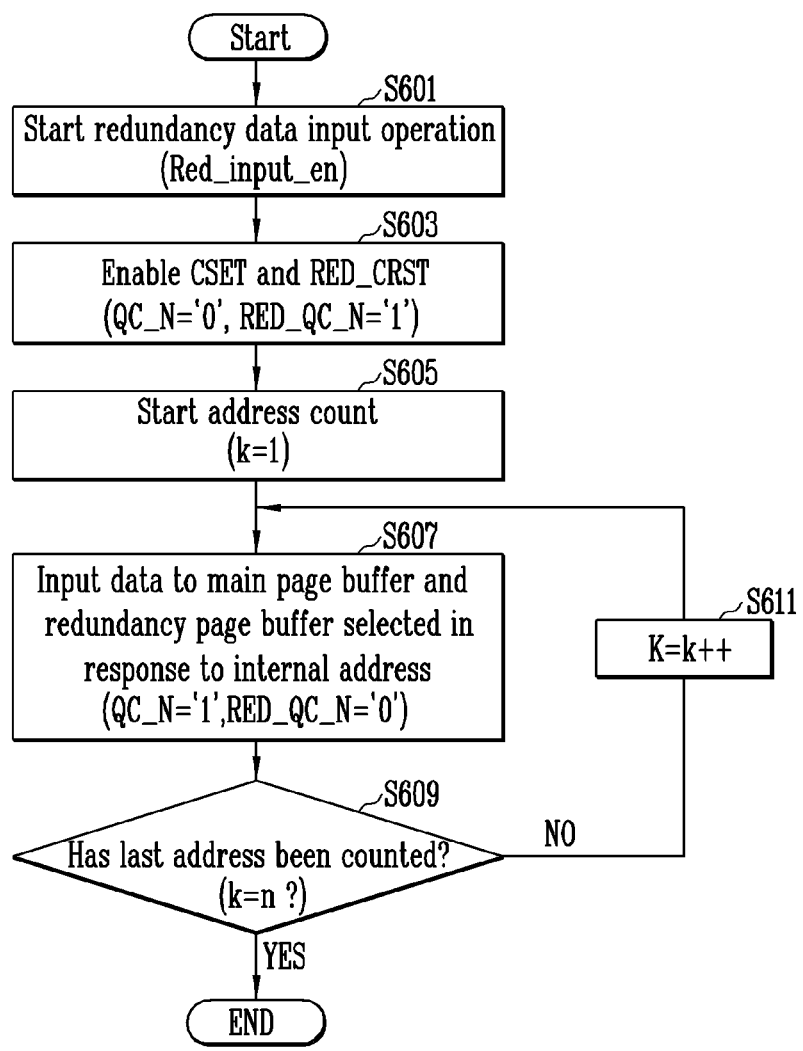
FIG. 6 a flowchart illustrating a redundancy data input operation according to an exemplary embodiment of this disclosure.

FIG. 6 a flowchart illustrating the redundancy data input operation according to an embodiment of the present invention, and FIG. 7 is a timing diagram of the control signals relating to the redundancy data input operation of FIG. 6.

The flowchart and the timing diagram of FIGS. 6 and 7 are described with reference to FIGS. 1 to 5.

Referring first to FIGS. 6 and 7, the redundancy data input operation is started at step S601, and the control logic 171 enables the redundancy data input enable signal Red_input_en. Furthermore, the control logic 171 makes the node QC_N of the main page buffer MPB '0' and makes the node RED_QC_N of the redundancy page buffer RPB '1' at step S603.

The precharge signal PRECH of a low level is inputted to the page buffer group 120. The precharge signal PRECH is received from the control logic 171.

In response to the precharge signal PRECH, the first and the second sense nodes SO1 and SO2 of the main page buffer MPB and the redundancy page buffer RPB are precharged to a high level.

When the first and the second sense nodes SO1 and SO2 are precharged to a high level, the 18th NMOS transistor N18 of the main page buffer MPB and the 24th NMOS transistor N24 of the redundancy page buffer RPB are turned on. Accordingly, the nodes K3 and K4 are coupled to the ground node.

When the main set signal CSET of a high level is inputted to the main page buffer MPB with the node K3 being coupled to the ground node, the 17th NMOS transistor N17 is turned on and the node QC_N is coupled to the ground node. That is, the node QC_N has a data state of '0'.

Furthermore, when the redundancy set signal RED_CRST of a high level is inputted to the redundancy page buffer RPB with the node K4 being coupled to the ground node, the 22nd NMOS transistor N22 is turned on and the node RED_QC is coupled to the ground node. Accordingly, the node RED_QC_N has a data state of '1'.

When the node QC_N and the node RED_QC_N of the main page buffer MPB and the redundancy page buffer RPB have different data states as described above, the control logic 171 controls the Y redundancy decoder 173 so that it starts an address count at step S605.

During the redundancy data input operation, the Y redundancy decoder 173 decodes the first and the second pass signals YPASS_REDADD<A: i> and YPASS_REDADD<B:j> for selecting one of the first to nth storage units 174a of the storage unit 174 in synchronization with the timing when the external addresses AX<13:2> are received.

In other words, during the redundancy data input operation, the Y redundancy decoder 173 counts addresses for sequentially selecting the first to $n^{th}$ storage units 174a in synchronization with the timing when the external addresses are received, irrespective of the external addresses, and outputs relevant signals of the first and the second pass signals YPASS_REDADD<A:i> and YPASS_REDADD<B:j>.

Accordingly, redundancy data is inputted to the nodes QC_N of the main page buffer MPB and to the node RED_QC_N of the redundancy page buffer RPB, used instead of the main page buffer MPB in response to the internal address (AX_int<13:2>) at step S607. Assuming that an n number of the repair addresses are stored, the Y redundancy decoder 173 counts addresses from '1' to 'n' and outputs relevant signals of the first and the second pass signals YPASS_REDADD<A: i> and YPASS_REDADD<B:j> at step S607, S609, and S611.

In response to the first and the second pass signals YPASS_REDADD<A:i> and YPASS_REDADD<B:j>, repair addresses stored in one of the first to $n^{th}$ storage units 174a of the storage unit 174 are outputted as the CAM latch addresses AX_CAM_Pre<13:2>.

In FIG. 6, when the Y redundancy decoder 173 counts addresses in synchronization with the timing when the external addresses are received at step S605, the first and the second pass signals YPASS_REDADD<A:1> and YPASS_REDADD<B:1> are outputted.

Accordingly, the first storage unit 174a of FIG. 2 is selected.

If the repair addresses stored in the first storage unit 174a are the addresses of the first column of the main cell unit 111, redundancy data is inputted to the nodes QC_N of the first main page buffer MPB and to the node RED_QC_N of the first redundancy page buffer RPB, which is used instead of the first main page buffer MPB, in response to the control signals of the control logic 171 at step 607.

The control logic 171 inputs the redundancy enable signal RED_EN of a high level, the first page buffer select signal PBSEL<1> of a high level, and the redundancy select signal PBSEL_RED of a high level to the page buffer control circuit 160. The first page buffer select signal PBSEL<1> is determined in response to the repair addresses stored in the first storage unit 174a. If the repair addresses stored in the first storage unit 174a are the addresses of a tenth column, the tenth page buffer select signal PBSEL<10> is outputted.

Furthermore, the first NAND gate NA1 of the page buffer control circuit 160 performs a NAND operation for the redundancy enable signal RED_EN of a high level and the inverted redundancy data input signal Red_input_en of a low level. The output of the first NAND gate NA1 becomes a high level. Furthermore, the first AND gate AN1 performs a NAND operation for the output of a high level from the first NAND gate NA1 and the first page buffer select signal PBSEL<1> of a high level.

The output of the first AND gate AN1 becomes the first main page buffer select signal PBSEL_PB<1>. Accordingly, the first page buffer select signal PBSEL_PB<1> becomes a high level.

When the first main page buffer select signal PBSEL_PB<1> becomes a high level, the $19^{th}$ and $20^{th}$ NMOS transistors N19 and N20 of the main page buffer MPB of FIG. 4A are turned on.

When data '0' is inputted to the first data line BITOUTb and data '1' is inputted to the second data line BITOUT, the data state of the node QC_N of the main page buffer MPB shifts to '1'.

When the data state of the node QC_N becomes '1', it is determined that the bit line BLe or BLo (that is, a column line) coupled to the relevant main page buffer MPB is a program pass in a program verification operation.

The second AND gate AN2 performs a NAND operation for the first page buffer select signal PBSEL<1> of a high level and the redundancy enable signal RED_IN. The output of the second AND gate AN2 becomes a high level. Accordingly, the redundancy select signal PBSEL_RED becomes a high level.

Furthermore, since the redundancy data input enable signal Red_input_en is in a high level, the third AND gate AN3 outputs the first redundancy input enable signal REDIN_EN<1> of a high level, and the fourth AND gate AN4 outputs the first redundancy page buffer select signal PBSEL_RED_PB<1> of a low level.

Accordingly, the $25^{th}$ and the $26^{th}$ NMOS transistors N25 and N26 of the redundancy page buffer RPB of FIG. 4B are turned off. Consequently, the data of the first and the second data lines BITOUTb and BITOUT is not inputted to the redundancy page buffer RPB.

Furthermore, since the first redundancy input enable signal REDIN_EN<1> is in a high level, the $27^{th}$ NMOS transistor N27 is turned on. Accordingly, the node RED_QC_N becomes '0'.

Through the above operation, data '1' is inputted to the node QC_N of the main page buffer MPB coupled to a fail column, and data '0' is inputted to the node RED_QC_N of the redundancy page buffer RPB coupled to a redundancy column replacing the fail column.

Furthermore, the address count continues in synchronization with the timing when the external addresses are received until the addresses of the $n^{th}$ storage unit 174a of the Y redundancy decoder 173 are outputted, and thus the first and the second pass signals YPASS_REDADD<A: i> and YPASS_REDADD<B:j> are outputted. Furthermore, the repair addresses stored in the storage unit 174 are sequentially outputted in response to the first and the second pass signals YPASS_REDADD<A:i> and YPASS_REDADD<B:j>.

Finally, the MUX 176 selects the CAM addresses AX_CAM<13:2> in response to the redundancy data input enable signal Red_input_en and outputs them as the internal addresses AX_int<13:2>. Accordingly, redundancy data is inputted to only the main page buffer MPB coupled to a fail column and only the redundancy page buffer RPB coupled to a redundancy column replacing the fail column.

Accordingly, the time to input redundancy data can be reduced as compared to a method of inputting redundancy data to all page buffers.

In the semiconductor memory device and the method of operating the same according to embodiments of the present invention, data is selectively inputted to a fail main page buffer and a fail redundancy page buffer using the repair column addresses. Accordingly, the time that it takes to input redundancy data can be reduced.

What is claimed is:

1. A semiconductor memory device, comprising:
   an address controller configured to store fail column addresses and sequentially output the fail column addresses while a first control signal is activated; and
   a control logic configured to perform control so that data indicating a program pass is inputted to each of main page buffers associated with the respective fail column addresses outputted from the address controller while the first control signal is activated,
   wherein the control logic is configured to input second data indicating an execution of a program to a redundancy page buffer associated with a redundancy address to replace each of the fail column addresses while first data indicating a program pass is inputted to a latch of each of the main page buffers associated with the respective fail column address.

2. The semiconductor memory device of claim 1, wherein the address controller comprises:
   an address decoding unit configured to generate a decoding signal whenever an external address is received while the first control signal is activated; and
   an address storage unit comprising a plurality of registers, wherein the address storage unit is configured to store the respective fail column addresses and to output the fail column address stored in the register selected in response to the decoding signal.

3. The semiconductor memory device of claim 2, further comprising a multiplexer configured to output one of the external address and the fail column address in response to the first control signal.

4. A semiconductor memory device, comprising:
   main page buffers coupled to respective main columns and coupled to a data line in response to a plurality of first select signals, respectively;
   redundancy page buffers coupled to respective redundancy columns and to the data line in response to a plurality of second select signals, respectively, and configured to store data, indicating an execution of a program, in response to a plurality of second control signals, respectively;
   an address controller configured to store fail column addresses and to sequentially output the fail column addresses while a first control signal is activated;
   a control logic configured to input data indicating a program pass through the data line while the first control signal is activated and to output a page buffer select signal for selecting the main page buffer associated with the fail column address outputted from the address controller and the redundancy page buffer associated with a redundancy column address to replace the fail column address; and
   a page buffer control circuit configured to enable one of the plurality of first select signals in order to select the main page buffer, corresponding to the page buffer select signal of the control logic, and enable one of the plurality of second control signals in order to select the redundancy page buffer, while the first control signal is activated.

5. The semiconductor memory device of claim 4, wherein the address controller comprises:
   an address decoding unit configured to generate a decoding signal whenever an external address is received while the first control signal is activated; and
   an address storage unit configured to include a plurality of registers for storing the respective fail column addresses and to output the fail column address stored in the register selected in response to the decoding signal.

6. The semiconductor memory device of claim 5, wherein the address controller further comprises an address latch circuit unit configured to temporarily store the fail column address outputted from the address storage unit and provide the stored fail column address to a multiplexer.

7. The semiconductor memory device of claim 5, wherein the address controller further comprises a multiplexer configured to output one of the external address and the fail column address in response to the first control signal.

8. The semiconductor memory device of claim 4, wherein the page buffer control circuit comprises:
   a main page buffer select circuit configured to output the first select signal corresponding to the page buffer select signal in response to a redundancy enable signal, the first control signal, and the page buffer select signal; and
   a redundancy page buffer control circuit configured to output the second select signal or the second control signal corresponding to the page buffer select signal in response to the page buffer select signal, the redundancy enable signal, and the first control signal.

9. The semiconductor memory device of claim 8, wherein the main page buffer control circuit comprises:
   a NAND gate configured to perform a NAND operation for the redundancy enable signal and an inverted signal of the second control signal; and
   a first AND gate configured to output the first select signal corresponding to the page buffer select signal by performing a NAND operation for the page buffer select signal and an output signal of the NAND gate.

10. The semiconductor memory device of claim 9, wherein the redundancy page buffer control circuit comprises:
    a second AND gate configured to perform an AND operation for the page buffer select signal and the redundancy enable signal;
    a third AND gate configured to output the second control signal corresponding to the page buffer select signal by performing an AND operation for the first control signal and the output signal of the second AND gate; and
    a fourth AND gate configured to output the second select signal corresponding to the page buffer select signal by performing an AND operation for the first control signal and an output signal of the second AND gate.

11. The semiconductor memory device of claim 4, wherein the control logic stores a first logical value in all latches of the main page buffers and a second logical value in all latches of the redundancy page buffers before activating the first control signal.

12. The semiconductor memory device of claim 11, wherein the first logical value is the data '0' and the second logical value is the data '1'.

13. A method of operating a semiconductor memory device, comprising:
    inputting a first logical value to latches of main page buffers coupled to a main column and a second logical value to latches of redundancy page buffers coupled to a redundancy column, before starting inputting redundancy data;
    sequentially selecting the main page buffers associated with fail column addresses in order to input the redundancy data; and
    changing data of the selected main page buffer into the second logical value and data of the redundancy page buffer coupled to a redundancy column line corresponding to the fail column address into the first logical value.

14. The method of claim 13, wherein sequentially selecting the main page buffers associated with fail column addresses comprises:
    sequentially selecting storage units in which the respective fail column addresses are stored whenever external addresses are received;
    outputting the fail column address stored in the selected storage unit; and
    selecting the main page buffer associated with the outputted fail column address.

15. The method of claim 14, wherein the first logical value is the data '0' and the second logical value is the data '1'.

* * * * *